(12) United States Patent
Hendriks (10) Patent No.: US 12,319,042 B2
(45) Date of Patent: Jun. 3, 2025

(54) MULTI-LAYER RELEASE STACK FOR LIGHT INDUCED TRANSFER OF COMPONENTS

(71) Applicant: Nederlandse Organisatie voor toegepast-natuurwetenschappelijk onderzoek TNO, 's-Gravenhage (NL)

(72) Inventor: Rob Jacob Hendriks, Waalre (NL)

(73) Assignee: Nederlandse Organisatie voor toegepast-natuurwetenschappelijk onderzoek TNO, 's-Gravenhage (NL)

(*) Notice: Subject to any disclaimer, the term of this patent is extended or adjusted under 35 U.S.C. 154(b) by 107 days.

(21) Appl. No.: 18/279,841

(22) PCT Filed: Mar. 1, 2022

(86) PCT No.: PCT/NL2022/050114
§ 371 (c)(1),
(2) Date: Aug. 31, 2023

(87) PCT Pub. No.: WO2022/186689
PCT Pub. Date: Sep. 9, 2022

(65) Prior Publication Data
US 2024/0140081 A1    May 2, 2024

(30) Foreign Application Priority Data

Mar. 2, 2021    (EP) .................................. 21160226

(51) Int. Cl.
*B32B 37/00*    (2006.01)
*B32B 7/12*    (2006.01)
(Continued)

(52) U.S. Cl.
CPC .............. *B32B 37/025* (2013.01); *B32B 7/12* (2013.01); *B32B 15/04* (2013.01);
(Continued)

(58) Field of Classification Search
CPC .............. B32B 15/04; B32B 2307/412; B32B 2307/748; B32B 2310/0837;
(Continued)

(56) References Cited

U.S. PATENT DOCUMENTS 9,548,332 B2    1/2017    Hu et al.
2017/0236811 A1*    8/2017    Pokhriyal .......... H01L 21/6835
257/91

(Continued)

FOREIGN PATENT DOCUMENTS

EP    3742477 A1    11/2020
JP    6119335 B2    4/2017
(Continued)

OTHER PUBLICATIONS

European Patent Office, International Search Report in corresponding International Application No. PCT/NL2022/050114, dated Jul. 8, 2022 (2 pages).

*Primary Examiner* — Sonya M Sengupta
(74) *Attorney, Agent, or Firm* — Leydig, Voit & Mayer, Ltd.

(57) ABSTRACT

A method and system for light induced transfer of components from a donor substrate to an acceptor substrate are described. The donor substrate includes a transparent carrier configured to carry the components facing the acceptor substrate, and a release stack. The release stack includes a light-absorbing layer, a melt layer, and an adhesive layer. The light-absorbing layer has a relatively high absorption coefficient for absorbing the light beam causing heat which is conducted to the melt layer. The light-absorbing layer has a relatively high melting temperature such that the light-absorbing layer can remain solid while the melt layer is melted. The adhesive layer adheres the components to the (Continued)

melt layer while the melt layer is solid and releases adhesion when the melt layer is melted.

16 Claims, 6 Drawing Sheets

(51) Int. Cl.
  *B32B 15/04* (2006.01)
  *H01L 21/67* (2006.01)
(52) U.S. Cl.
  CPC .. *H01L 21/67132* (2013.01); *B32B 2307/412* (2013.01); *B32B 2307/748* (2013.01); *B32B 2310/0837* (2013.01)
(58) Field of Classification Search
  CPC ... B32B 37/025; B32B 7/12; H01L 21/67132; H01L 21/6835; H01L 2221/68322; H01L 2221/68363; H01L 2221/68381; H01L 25/0753; H10H 20/01
  See application file for complete search history.

(56) References Cited

U.S. PATENT DOCUMENTS

| | | |
|---|---|---|
| 2018/0333945 A1 | 11/2018 | Li et al. |
| 2018/0374738 A1 | 12/2018 | Lee et al. |
| 2019/0051630 A1 | 2/2019 | Bayless et al. |
| 2019/0393069 A1 | 12/2019 | Paranjpe et al. |
| 2020/0168498 A1* | 5/2020 | Marinov ............ B23K 26/0673 |
| 2020/0357950 A1 | 11/2020 | Takagi |
| 2024/0140081 A1* | 5/2024 | Hendriks ............ H01L 21/6835 |

FOREIGN PATENT DOCUMENTS

| | | |
|---|---|---|
| WO | WO 2017/075776 A1 | 5/2017 |
| WO | WO 2020/168174 A1 | 8/2020 |
| WO | WO 2020/188780 A1 | 9/2020 |

* cited by examiner

MULTI-LAYER RELEASE STACK FOR LIGHT INDUCED TRANSFER OF COMPONENTS

CROSS-REFERENCE TO RELATED APPLICATIONS

This patent application is a U.S. National Phase of PCT International Application No. PCT/NL2022/050114, filed Mar. 1, 2022, which claims priority to European Application No. 21160226.3, filed Mar. 2, 2021, which are both expressly incorporated by reference in their entireties, including any references contained therein.

TECHNICAL FIELD AND BACKGROUND

The present disclosure relates to methods and systems for light induced transfer of components such as chips from a donor substrate to an acceptor substrate. The disclosure also relates to a donor substrate for use in such method or system.

Controlled transfer of small components has various applications, e.g. in the placement of μLEDs. Light induced transfer can be used to selectively transfer components from a donor substrate to an acceptor substrate. To facilitate the transfer, a release stack can be provided between the donor substrate and the components. In one technique components are glued onto a carrier substrate, and released from the carrier due to rapid blister formation. In another technique a flat glass plate with a light absorbing layer is coated with a glue. The components can be released due to decomposition or melting of the glue when the light absorbing layer rapidly heats up by the light pulse.

There remains a need for further improvement in the controlled transfer and placement of components.

SUMMARY

Some aspects of the present disclosure relate to methods and systems for light induced transfer of components from a donor substrate to an acceptor substrate. Other or further aspects relate to the donor substrate for use in such methods or systems. Typically a transparent carrier is configured to carry the components facing the acceptor substrate, and a release stack is disposed between the transparent carrier and the components for releasing one or more of the components from the donor substrate onto the acceptor substrate following illumination of the release stack by a light beam through the transparent carrier.

As described herein the release stack of the donor substrate comprises a light-absorbing layer, a melt layer, and an adhesive layer. The light-absorbing layer is disposed between the transparent carrier and the melt layer. By providing the light-absorbing layer with a relatively high absorption coefficient the light beam can be efficiently absorbed thereby causing the light-absorbing layer to be heated. By providing the heated light-absorbing layer in thermal contact with the melt layer, the absorbed heat can be conducted to the melt layer so a temperature of the melt layer can rise above its melting temperature. By providing the material of the melt layer with a relatively low melting temperature, this material can be easily melted. By providing the light-absorbing layer with a relatively high melting temperature (at least higher than the melting temperature of the melt layer), the light-absorbing layer can remain solid while the melt layer is melted by the heat conducted from the light-absorbing layer. By providing the adhesive layer between the components and the melt layer, the components can be easily adhered to the melt layer while the melt layer is solid. Furthermore, this adhesion can be released when the melt layer is melted. By segmenting at least the adhesive layer between the components, the components can be more easily transferred. For example, shear forces during transfer can be alleviated if part of the adhesive layer can be released together with the component without being connected to surrounding parts of the adhesive layer, e.g. holding adjacent (non-transferred) components or other parts of the adhesive layer. Also the melt layer and/or light-absorbing layer can be segmented to provide further advantages, e.g. further separation and/or isolation of heat to the respective stack. While the segmentation has particular advantages, the components may in principle also be released without requiring segmentation. For example, part of a (continuous) adhesive layer which holds the component may be relatively fragile and simply break from the surrounding adhesive layer when the melt layer between the component and light-absorbing layer is locally melted and the adhesion is diminished. For example, the component can be pulled, pushed, or otherwise released from the carrier by various forces such as gravity and/or de-wetting or accumulating of the melted material with optional gas generation.

Typically, an area of the light-absorbing layer (e.g. forming a part of the release stack holding a respective component), is illuminated with a light beam through the transparent carrier. This can result in heating a respective part of the light-absorbing layer. The heat can then be conducted to an adjacent melt layer of the release stack thereby at least partially melting the adjacent melt layer, preferably while the respective part of the light-absorbing layer remains substantially solid. Accordingly the at least partial melting of the adjacent melt layer can cause a loss of adhesion between the adjacent melt layer and a respective part of the adhesive layer of the release stack (adhering the respective components to the adjacent melt layer). So the loss of adhesion can cause release and transfer of the respective component. For example, one or more light sources and/or masks are configured and controlled to generate one or more light beams for transferring respective components as described herein.

In some embodiments, a low gas generation laser release stack is used to rapidly transfer components from a carrier towards an acceptor substrate. Due to low pressure build-up the components can transfer at low velocity (with minimal or no shockwave) and because there is less turbulent air (gas) around, the component may be substantially prevented from rotating while being transferred. In one embodiment, the stack comprises or essentially consists of a thermally stable light-absorbing layer, melt layer and an adhesive layer. Preferably, the melt layer is a metal layer with a relatively low melting temperature. More preferably, the light-absorbing is also a metal layer but with a relatively high melting temperature. Most preferably the adhesive layer essentially consists of a polymeric adhesive with a decomposition temperature that is higher than and/or closely matched with the melting temperature of the metal melt layer.

In some embodiments, a laser beam or other light source rapidly heats up the light-absorbing layer sufficiently, such that the underlaying metal layer starts melting. While in molten state, the polymeric adhesive which bonds the component to the metal melt layer may release, e.g. due to de-wetting effects. As the surface tension of liquid metal is typically much higher than the surface energy of solid polymers, the adhesion can released between the two layers. In contrast, because the surface energy of a solid metal layer is typically very high, the metal melt layer can stick to the metallic light-absorbing layer. For example, only the polymeric part is transferred together with the component. After transfer, the polymeric layer can be removed from the component, e.g. through wet or dry etching or thermal decomposition In some embodiments, to increase the transfer velocity of the component, the polymeric adhesive can be tuned to decompose slightly at the melting point of the melt layer. During melting, the contact area between the adhesive and melt layer can be reduced, e.g. because of the high surface tension of molten metal. So the material may tend to ball up. Even though the evaporation (decomposition) temperature of a polymeric material such as SU-8 is around 350° C. at low heating rates, at very high heating rates decomposition of polymers tends to occur at much higher temperatures. Choosing a polymer/metal combination where the polymer has a higher decomposition temperature as the melting temperature of the metal (e.g. Sn+SU8, Zn+polyimide) can make it possible to release the components without any gas generation. For example, gravitational forces or electrostatic forces can be used to release the component from the carrier and transfer towards the acceptor substrate. Typically, it is preferred to stay below the boiling point (evaporation temperature) of the metal melt material. Otherwise the evaporated metal may cause additional pressure and deposit on colder surrounding surfaces.

Besides controlling the amount of gas generation, it is also preferred to heat the light absorbing layer as homogeneous as possible to ensure the metal melt layer melts at the same time. In some embodiments, a flat top beam profile is used that specifically heats the stack above one component and does not interfere with any adjacent components. As it is also preferred to have very narrow dicing streets between the components (e.g. ≤5 µm) to reduce the amount of substrate waste, it may be increasingly difficult to selectively heat a single component. Especially when increasing the transfer speed, timing jitter on the laser may be more difficult to control. Hence it is preferred to use a mask that is precisely aligned with the components and trim the laser pulse to the right dimensions.

As typically only a fraction of the components need to be transferred (e.g. for µLED displays), the laser pulse can be (much) larger than the component. For example, a relatively large flat top beam in combination with a mask can result in a robust process that doesn't require accurate and expensive laser positioning control systems. For example, a maximum laser spot size can be calculated as twice the component pitch minus component size minus laser accuracy. For example: 2×200 µm (component pitch)–40 µm (component size)–10 µm (laser accuracy)=350 µm. At these large spot sizes, it can be relatively easy to obtain a homogeneous heat flux in the middle, especially with beam shaping optics such as a nShaper.

To reduce the heat affected zone and further limit the amount of gas generation, in some embodiments the size of the metal melt layer underneath the component is reduced. For example, to automatically centre the metal melt layer under the component, the layer can be under-etched in an etching bath. The more centralized the component is released, the better the transfer process.

Other or further improvement can come from strategic transfer of components to ensure they are propelled straight towards the acceptor substrate. For example, in case there is any gas generation under the component, typically this gas will escape easiest where there is the lowest flow resistance. Even with an almost perfectly homogenous heat flux, inhomogeneous pressures around the component may lead to undesirable component trajectories, e.g. rotating of the components during transfer. To alleviate this problem, for example a checkers board approach can be used wherein the components are transferred in an alternative manner. By making sure the components to be transferred are either surrounded or not surrounded on opposite sides by adjacent components, the pressure build-up around the transferred component can be more homogenous. When the trajectory of the component can be better controlled in a straight down direction, larger transfer gaps can be realized which may be beneficial for industrialization as height positioning does not need to be very precise.

To improve performance, for example heat flux and fluence can be controlled. Preferably, the light-absorbing layer heats up without going to its melting or evaporation temperature. Furthermore, the high intensity light preferably does not reach the component to prevent damage. With respect to the layer thickness of the metal melt layer, the thicker the layer, the higher the fluence needs to be to melt the entire layer. Furthermore, there is a chance that both metals diffuse and form an alloy. If there is relatively too much molten metal, the light-absorbing layer may completely diffuse into the molten pool. If the light-absorbing layer melts, inhomogeneity effect may occur. To control the melting time, the pulse time and fluence can be controlled. Preferably the pulse time is in the order of nano- or picoseconds. Shorter pulses in the order of femtoseconds may lead to "cold" ablation of the light-absorbing layer, whereas longer pulses in the order of microseconds may increase the thermal affected area. Typically longer pulses can also be less effective as most heat may be lost due to heat sinking of the carrier and components. The thickness of the adhesive layer can be increased to reduce the heat flow towards the component. While relatively high temperatures are achieved at the light-absorbing layer and melt layer, the component can remain relatively cold if it is thermally insulated by the adhesive.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that the terms "consisting essentially of" and "essentially consists of", as used herein with reference to materials (e.g. metal, semi-conductor, polymer), means that further components may present insofar as these do not materially affect the essential characteristics of the compound or composition. Alternatively, or additionally, these term can be used to signify a majority constituent, e.g. with a mass percentage>90%, >95%, >99, >99.9% or 100% (or simply "consists of"). It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The invention is described more fully hereinafter with reference to the accompanying drawings, in which embodiments of the invention are shown. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

Figure 1A:
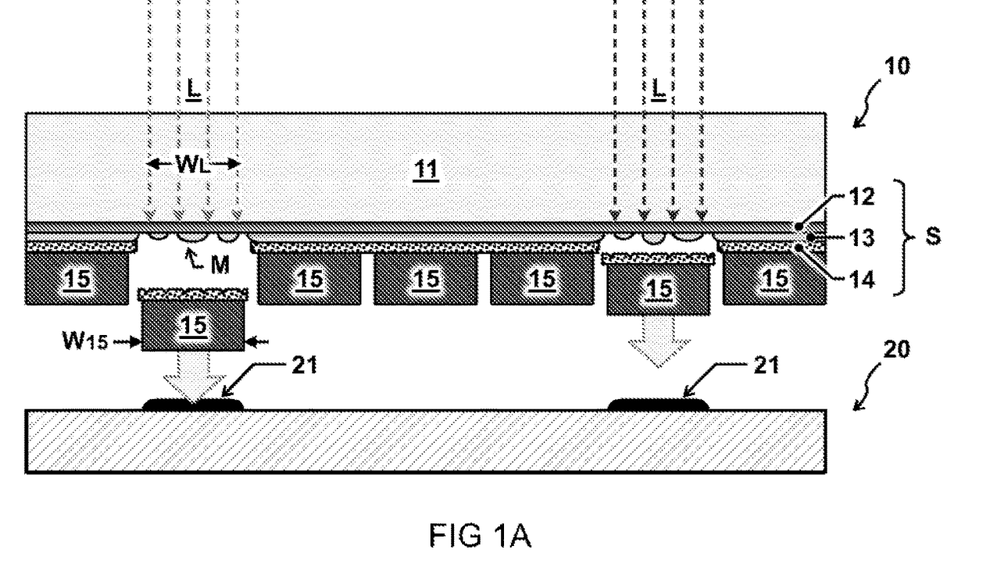
FIG. 1A illustrates transfer of components from a donor substrate to an acceptor substrate by illuminating a release stack.

FIG. 1A illustrates transfer of components 15 from a donor substrate 10 to an acceptor substrate 20 by illuminating a release stack "S". In some embodiments, the donor substrate 10 comprises a transparent carrier 11 configured to carry the components 15 facing the acceptor substrate 20. Preferably, the release stack "S" is disposed between the transparent carrier 11 and the components 15 for releasing one or more of the components 15 from the donor substrate 10 onto the acceptor substrate 20. Typically, the release follows directly after illumination of the release stack "S" by a light beam "L" through the transparent carrier 11.

In some embodiments, the release stack "S" comprises a melt layer 13, e.g. having a relatively low melting temperature "Tm13". In other or further embodiments, the release stack "S" comprises a light-absorbing layer 12 disposed between the transparent carrier 11 and the melt layer 13. In one embodiment, the light-absorbing layer 12 has a relatively high absorption coefficient. This may allow efficiently absorbing the light beam "L" thereby causing the light-absorbing layer 12 to be heated. In another or further embodiment, the heated light-absorbing layer 12 is in thermal contact with the melt layer 13. This may allow conducting of the heat to the melt layer 13. In this way a temperature of the melt layer 13 can rise above its melting temperature "Tm13". Preferably, the light-absorbing layer 12 has a relatively high melting temperature "Tm12" which is higher than the melting temperature "Tm13" of the melt layer 13. In this way, the light-absorbing layer 12 can remain essentially solid while the melt layer 13 is essentially melted by the heat conducted from the light-absorbing layer 12. In other or further embodiments, the release stack "S" comprises an adhesive layer 14 disposed between the components 15 and the melt layer 13. This allows easily adhering the components 15 to the melt layer 13 while the melt layer 13 is solid and releasing adhesion when the melt layer 13 is melted (indicated by "M" in the figures).

Some embodiments comprise selectively illuminating an area of the light-absorbing layer 12, forming a part of the release stack "S" holding a respective component 15, with a light beam "L" through the transparent carrier 11. In this way a respective part of the light-absorbing layer 12 can be selectively (locally) heated. Preferably, the heat is conducted to an adjacent melt layer 13 of the release stack "S". In this way the adjacent melt layer 13 can be at least partially melted. Preferably, the respective part of the light-absorbing layer 12 remains substantially solid while the melt layer 13 is melted. Advantageously, the melting of the adjacent melt layer 13 can cause a loss of adhesion between the adjacent melt layer 13 and a respective part of the adhesive layer 14 of the release stack "S" adhering the respective components 15 to the adjacent melt layer 13. Accordingly, the loss of adhesion can cause release and transfer of the respective component 50. For example, the release allows the component to fall and/or be pushed from the donor substrate 10 to the acceptor substrate 20. Preferably, the donor substrate 10 is arranged above the acceptor substrate 20 so a force of gravity may help in the transfer. Alternatively, or additionally, the transfer can induced by forces following the illumination. For example, the release can be induced by the melting and/or accompanied by at least some gas formation. Aspects of the present disclosure can also be embodied as a system comprising the donor substrate 10 as described herein. For example, the system comprises a light source configured and/or controller configured to generate the light beam "L" as described herein.

In some embodiments, the melt layer 13 comprises or essentially consists of metal. The inventors find that a metal melt layer can provide particular benefit to the present methods and systems, e.g. providing a steady connection to various types of adhesive materials and well controlled release of the adhesion at a predictable melting point. Alternatively, or additionally, also other melting materials can be used, e.g. semi-conductor material, alloys, etc. Advantageously, e.g. for the purposes of a melt layer as described herein, eutectic alloys may combine the bonding characteristics of the component metals with the flow properties of pure metals. Furthermore, such alloys can transform directly from solid to liquid state, or vice versa from liquid to solid state, at a specific composition and temperature without passing a two-phase equilibrium. Furthermore, the eutectic temperature can be much lower than the melting temperature of the two or more pure elements. In other or further embodiments, the light-absorbing layer 12 comprises or essentially consists of metal. The inventors find that a metal light-absorbing layer 12 can provide particular benefit to the present methods and systems, e.g. providing relatively good thermal conduction. Moreover, the inventors find that when both the light-absorbing layer 12 and melt layer 13 are metal layers, the melted melt layer 13 may tend to stick more to light-absorbing layer 12 than to the adhesive layer 14, in particular when the adhesive layer 14 is not a metal layer. Similar advantages may also be achieved using a light-absorbing layer made of a semi-conductor material, e.g. including silicon and silicon carbide.

In some embodiments, the adhesive layer 14 comprises or essentially consists of a polymer based adhesive, preferably a cross-linking polymer such as an epoxy. Advantageously, a polymeric adhesive typically has relatively low heat conduction compared to metal, so heat conduction to the components 15 can remain relatively low. Moreover, the surface tension of liquid metal is typically much higher than the surface energy of solid polymers. So the adhesion between the adhesive layer 14 and melt layer 13 can be released. In contrast, because the surface energy of a solid metal layer is typically relatively high, the metal melt layer 13 may predominantly stick to the metallic light-absorbing layer. This means that, in some embodiments, only the polymeric part is transferred together with the component. Also other materials could be envisaged for the adhesive layer, preferably comprising, or essentially formed by, an organic and/or non-metal layer.

Irrespective of the specific materials, it is preferred that the light-absorbing layer 12 has a higher surface energy per unit area (e.g. mJ/m$^2$) than the adhesive layer 14, e.g. by at least a factor two, three, five, ten, twenty, fifty, or more. The higher the difference in surface energy, the more the melted material may tend to stick to the light-absorbing layer 12 instead of the adhesive layer 14. Typically, the surface energy of the melt layer 13 is lower than the light-absorbing layer 12 it melts at lower temperature, and most preferably higher than the adhesive layer 14. In one embodiment, upon melting of a melt layer 13 in the release stack "S" of a selected component 15, the melt layer 13 predominantly sticks to the light-absorbing layer 12 of the release stack "S" while the adhesive layer 14 of the selected components 15 predominantly sticks to the selected component 15. For example, the adhesive layer 14 is transferred to the acceptor substrate 20 with the selected component 15 while the melt layer 13 predominantly remains with part of the release stack "S" on the donor substrate 10. Preferably, the transferred adhesive layer 14 is removed from the selected component 15 after transfer. For example, a polymeric adhesive layer 14 can be removed from the component through wet or dry etching. For example, more than fifty percent of the melted material sticks to the light-absorbing layer 12, preferably more than seventy, or even more than ninety percent. Most preferably substantially all of the melted material remains with the stack on donor substrate 10.

Figure 1B:
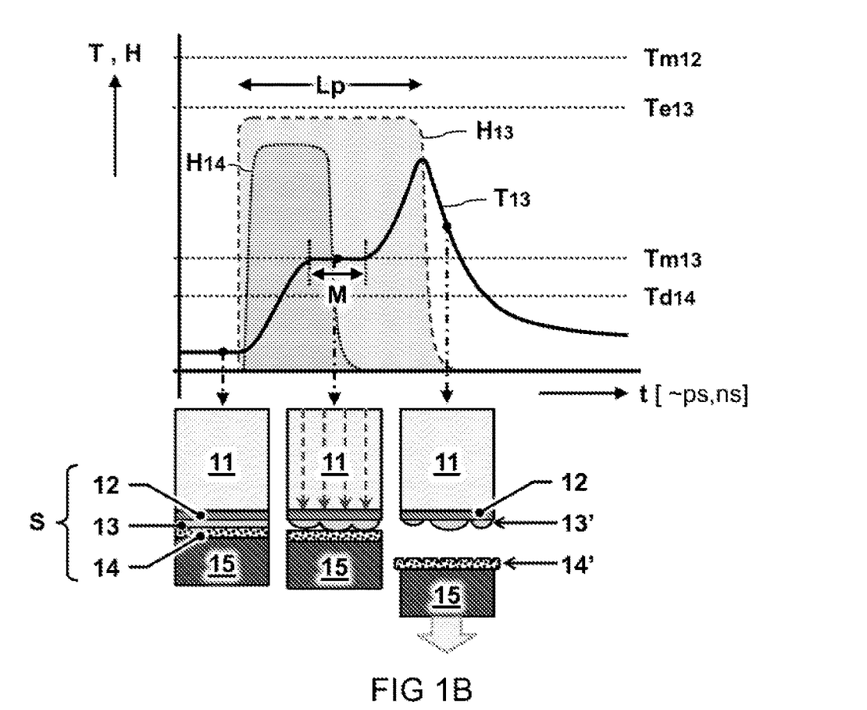
FIG. 1B illustrates relative temperatures and a sequence of releasing a component by light induced heating of select layers in the release stack.

FIG. 1B illustrates various temperatures "T" and a sequence of releasing a component 15 by light induced heating "H" of select layers in the release stack "S". Without being bound by theory, the graph illustrates a duration of a light pulse "Lp", resulting in heat transfer "H13" to the melt layer 13, heat transfer "H14" to the adhesive layer 14, and the resulting melt layer temperature "T13" (arbitrary scaling). Below the graph, various stages of the component release are shown. As illustrated in the graph, the melt layer temperature "T13" typically first increases due to heat transfer "H13" caused by the light pulse "Lp" illuminating the light-absorbing layer. When the melt layer temperature "T13" reaches the melting temperature "Tm13", the rise in temperature may plateau while energy of the heat transfer "H13" is used for melting the material indicated by "M". As a consequence to the melting of the melt layer 13, contact between the melt layer 13 and the adhesive layer 14 can be lowered and eventually lost so the heat transfer "H14" to the adhesive layer 14 may be halted even while heat transfer "H13" to the melt layer 13 may continue. Advantageously, the halted heat transfer "H14" to the adhesive layer 14 may alleviate disintegration of the adhesive layer 14 and/or alleviate damage to the component 15 due to overheating. So in effect, the melt layer 13 can also act as a buffer protecting the component 15 from damage.

In some embodiments, the relatively low melting temperature "Tm13" of the melt layer 13 is less than thousand degrees Kelvin (<~700° C.), preferably less than six hundred degrees Kelvin (<~300° C.). The lower the melting temperature of the melt layer 13, the less energy may be needed for melting, e.g. allowing a less intense light beam "L" and/or less chance of damaging the component. For example, suitable materials for the melt layer may include Aluminium (Tm≈660° C.), Zinc (Tm≈420° C.), Tin (Tm≈232° C.), and/or Indium (Tm≈156° C.).

In other or further embodiments, the melting temperature "Tm12" or disintegration/evaporation temperature in case of a non-melting material of the light-absorbing layer 12 is higher than the melting temperature "Tm13" of the melt layer 13, e.g. by at least ten degrees Kelvin, preferably at least fifty degrees Kelvin, more preferably at least one hundred degrees Kelvin, most preferably at least two hundred degree Kelvin, or even more than five hundred degrees Kelvin. The higher the difference between the melting temperatures Tm12,Tm13, the easier it can be ensured that the light-absorbing layer 12 remains substantially solid while the melt layer 13 is at least partially melted by the heat conducted from the light-absorbing layer 12. Preferably, the melting temperature "Tm12" or disintegration/evaporation temperature in case of a non-melting material is at least thousand degrees Kelvin≥~ 700° C., more preferably at least two thousand degrees Kelvin. A particularly suitable metal for use in the light-absorbing layer 12 includes Molybdenum which has a relatively high melting temperature of 2896 K (2623° C.). Also other metal with relatively high melting temperature can be used such as Chromium (2180K, 1907° C.) with Alternative to metals, also other materials can be used for the light-absorbing layer 12, e.g. semiconductor materials or other materials capable of conducting heat to the melt layer 13 while remaining solid, preferably having relatively high absorbance to the light beam "L". In some embodiment, a wetting control layer 12w can be provided between the (main) light-absorbing layer 12 and the melt layer 13. For example, suitable materials for the wetting control layer 12w may include oxides such as aluminium oxide or silicon oxide.

In some embodiments, the light beam "L" illuminating the release stack "S" is configured to cause a temperature "T13" of the melt layer 13 to rise above its melting temperature "Tm13" but remain below its evaporation temperature Te13. For example, an intensity and/or duration of the light beam "L" is adapted in relation to an absorbance of the light-absorbing layer 12 to cause a specific amount of energy of the light beam "L" to be deposited in the light-absorbing layer 12 leading to a specific rise in temperature of the light-absorbing layer 12 and specific amount of heat transfer to the melt layer 13 sufficient to cause the melt layer 13 to melt but not sufficient to cause substantial boiling and/or evaporation of the melt layer 13. The more evaporation of the melt layer 13 can be prevented, the more controlled can be the release of the components 15. For example, an explosive release of the components can be alleviated. Advantageously, the evaporation or boiling temperature of the melt layer can be much higher than its melting temperature, especially for a metal melt layer. For example, the evaporation temperature Te13 of the melt layer 13 is higher than its melting temperature "Tm13" by at least five hundred degrees Kelvin, preferably at least one thousand degrees Kelvin, or even more than fifteen hundred degrees Kelvin.

The higher the difference between the melting and evaporation temperatures, the easier evaporation of the melt layer can be prevented.

In some embodiments, the adhesive layer 14 has a disintegration temperature Td14 that is above the melting temperature "Tm13" of the melt layer 13 [Td14>Tm13], or at least within (higher than) five hundred degrees Kelvin below the melting temperature "Tm13" of the melt layer 13 [Td14>(Tm13−500K)], preferably within four hundred degrees Kelvin, or within three hundred degrees Kelvin. The higher the evaporation or disintegration temperature Td14 of the adhesive layer 14, the better inadvertent disintegration can be prevented, and a more controlled release of the component 15 obtained. It is noted that the disintegration temperature Td14 of the adhesive layer 14 is typically applicable for prolonged exposure to that temperature. So it can be tolerated that the adhesive layer 14 is shortly exposed to temperatures of the adjacent melt layer 13 above the disintegration temperature Td14, also because the melted material tends to stick to the light-absorbing layer 12 and/or dewet from the adhesive layer 14. For example, suitable materials for the adhesive layer may include photoresist materials such as SU-8. Also other materials can be used, e.g. polyimide.

As non-limiting examples, consider the following table with approximate parameters.

| Material | Function | Surface energy (mJ/m$^2$) | Melting temp. (° C.) | Evaporation (° C.) |
| --- | --- | --- | --- | --- |
| Molybdenum | light-absorbing layer | 2050 | 2623 | 5560 |
| Chromium | light-absorbing layer | 1642 | 1907 | 2944 |
| Aluminum oxide | wetting control layer | 638 | 2072 | 2977 |
| Silicon dioxide | wetting control layer | 287 | 1710 | 2950 |
| Aluminum | melting layer | 840 | 660 | 2327 |
| Tin | melting layer | 526 | 232 | 2602 |
| Indium | melting layer | 560 | 156 | 2072 |
| Polyimide | adhesive layer | 43 | NA | ~500 (at low heating rate) |
| SU-8 | adhesive layer | 33-38 | NA | ~350 (at low heating rate) |

In some embodiments, the light beam "L" illuminating the release stack "S" is provided as a relatively short a light pulse, e.g. having a FWHM duration of less than one millisecond, preferably less than hundred nanosecond, more preferably less than ten nanosecond, or even less than one nanosecond. For example, the light can be provided as a nanosecond or picosecond pulse. The shorter the light pulse, the higher the intensity per unit of time for the duration of the pulse. This may cause relatively short and intense heating of the stack, and melting of the component preferably before heat disintegrates the adhesive layer 14 and/or before the heat damages the components 15.

In some embodiments, the light-absorbing layer 12 is configured to absorb at least ten percent of the light beam "L" illuminating the release stack "S", preferably at least twenty percent, more preferably at least fifty or sixty percent, most preferably at least ninety percent. For example, the light beam "L" has a wavelength between 100-2000 nm (e.g. monochrome or broadband light), preferably a NIR laser (e.g. 1064 nm). Also other wavelengths can be used, e.g. UV, visible or infrared, as long as the material of the light-absorbing layer 12 can sufficiently absorb that wavelength.

In some embodiments, the light beam "L" is configured to exclusively illuminate a subarea of the light-absorbing layer 12 forming part of a selected release stack "S" holding a selected component 15, without illuminating immediately adjacent areas the light-absorbing layer 12, thereby exclusively releasing the selected component 15 while adjacent components remain attached to the donor substrate 10. For example, the light beam "L" has a beam width "WL" that is approximately equal to or smaller than a width "W15" of the selected component, and/or the light beam "L" is centred on the selected component. In one embodiment, the light beam "L" is generated having a relatively narrow beam width which illuminates one or more subareas of the release stack "S" corresponding to one or more components. In another or further embodiment, the light beam "L" is focused to a relatively narrow beam width, e.g. using one or more lenses/mirrors projecting a relatively small spot onto the one or more subareas of the release stack "S". In another or further embodiment, a relatively wide light beam "L" is shaped or patterned, e.g. using a mask pattern, to generate one or more relatively narrow light beams impinging the one or more subareas of the release stack "S". In one embodiment, the light beam "L" is generated by a laser, e.g. illuminating a specific component or part of a mask pattern. Also other light sources can be used, e.g. a flash lamp illuminating part of a mask pattern, or the whole mask.

Figure 2A:
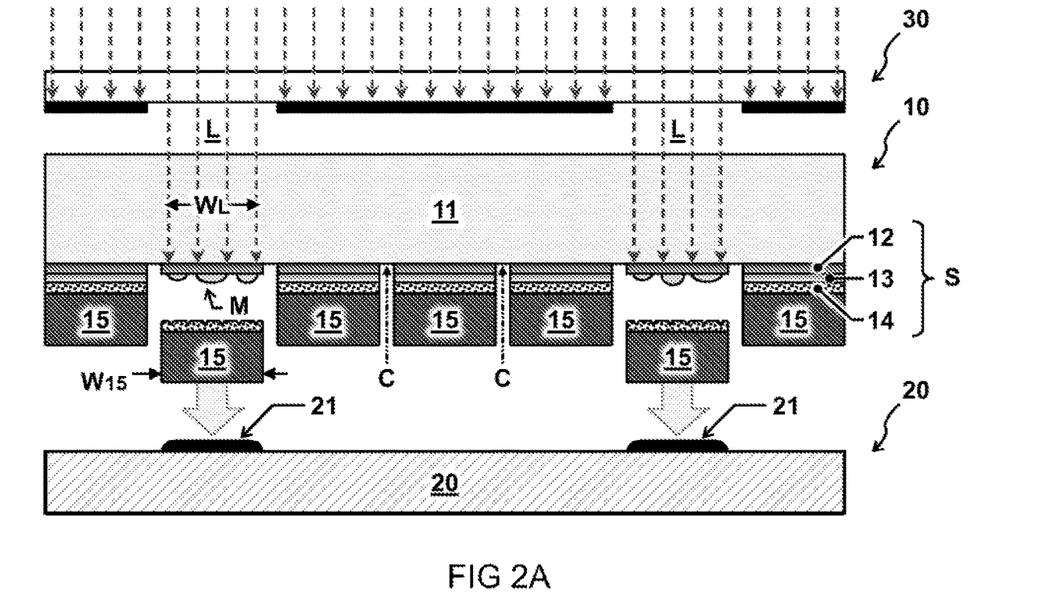
FIGS. 2A and 2B illustrate further aspects including cutting and/or etching parts of the release stack
Figure 2B:
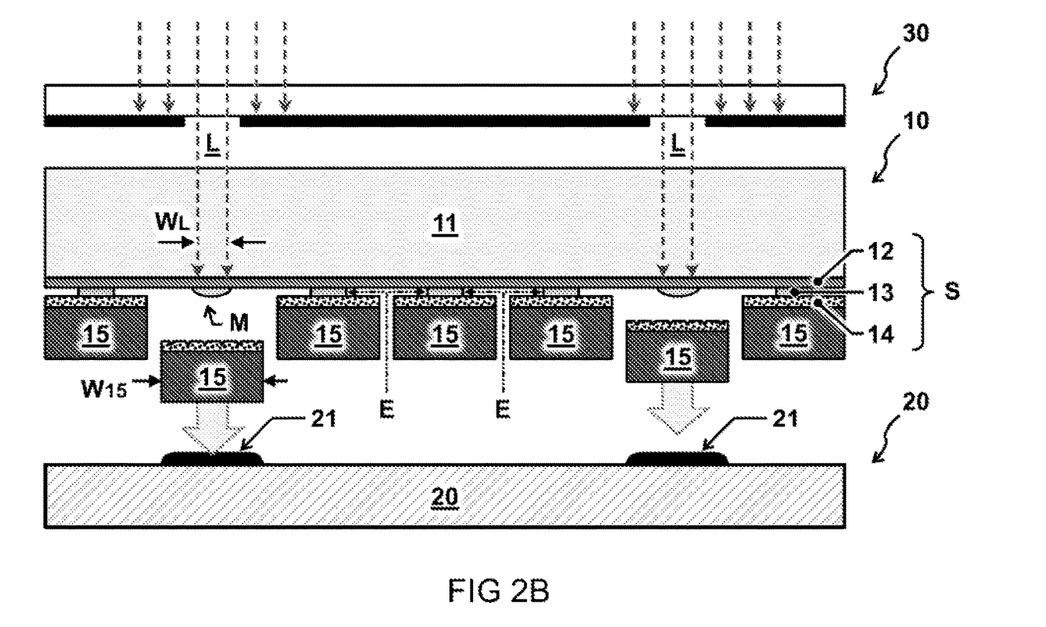

FIGS. 2A and 2B illustrate further aspects including cutting and/or etching parts of the release stack "S". In some embodiments, the release stack "S" is at least partially segmented or diced, e.g. along lanes or cut lines "C", between and/or around the components 15 (in projected view). For example, one or more layers of the stack can be segmented before or after connecting the components, preferably at least prior to the transfer. Preferably, at least the adhesive layer 14 is segmented so that parts of the adhesive layer 14 holding different components 15 are separate from each other. In this way, the transfer of individual components 15 can be better controlled with less interference of intermediate pieces of the adhesive layer 14. More preferably, also the melt layer 13 is segmented so that parts of the melt layer 13 corresponding to different components 15 are separate from each other. In this way, the melted material of a released component can remain separate from the melt layer 13 of adjacent components e.g. preventing interference with later released components. Most preferably, also the light-absorbing layer 12 is segmented so that parts of the light-absorbing layer 12 corresponding to different components 15 are separate from each other. In this way heating of the light-absorbing layer 12 can remain better localized and/or heat transfer to adjacent areas of the light-absorbing layer 12 corresponding to neighbouring components prevented. It can also be beneficial for aligning the laser to the components from the backside.

In some embodiments, e.g. as shown in FIG. 2B, at least part of the melt layer 13 is removed to provide respective undercuts between the components 15 and the donor substrate 10. In one embodiment, an area of the melt layer 13 holding a respective component 15 is smaller than an area of the respective component, e.g. by at least a factor two, three, four, five, or more. By providing a relatively small area melt layer 13, this material can be more easily melted to release the component without melting adjacent parts of the melt layer 13. Preferably, the smaller area is still centred on the respective component, e.g. to alleviate rotating of the component during transfer. In another or further embodiment (not shown), the adhesive layer 14 can also have a smaller area, e.g. so less material needs to be removed later. In another or further embodiment not shown, also the light-absorbing layer 12 can have a smaller area to further improve heat separation with neighbouring components. For example, parts of the melt layer 13 and/or other layers can be removed below the components by etching indicated by "E". In other or further embodiments, a width "WL" of the light beam "L" is smaller than a width "W15" of the respective component 15 being released. For example, the area or width "WL" of the light beam "L" can be adjusted to the area of the melt layer 13.

Figure 3A:
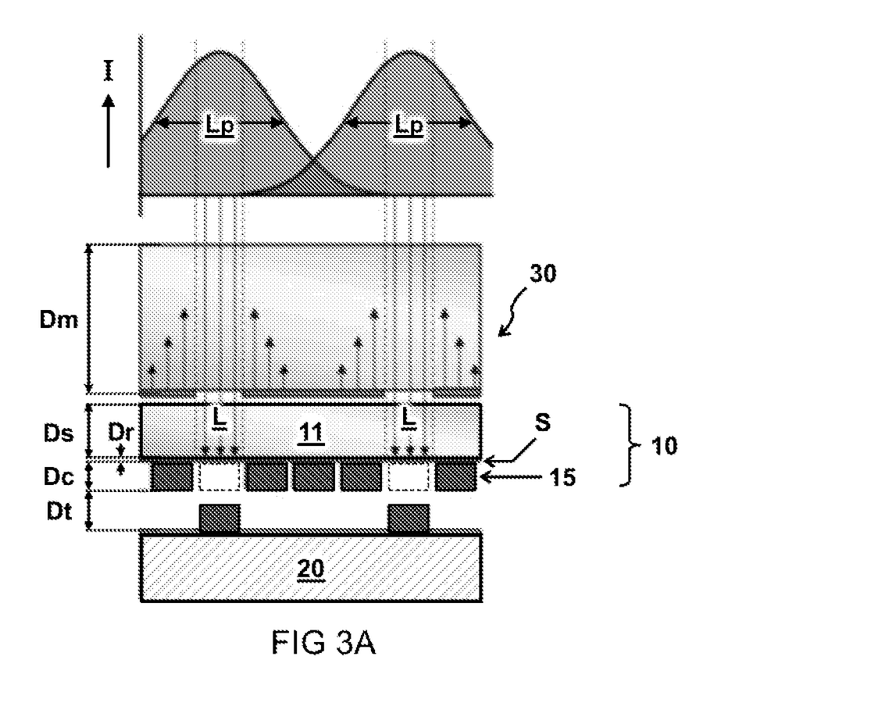
FIG. 3A illustrates masking of light pulses to form relatively narrow light beams, and relative thicknesses of various layers.

FIG. 3A illustrates masking of light pulses "Lp" to form relatively narrow light beams L, and relative thicknesses of various layers. In some embodiments, a mask 30 is aligned with the donor substrate 10. In one embodiment, the mask 30 comprises a set of mask windows (open areas) aligned with a subset of the components 15 on the donor substrate 10. In another or further embodiment, a set of light spots (e.g. light pulses Lp) is used to sequentially or simultaneously illuminate the set of mask windows. In another or further embodiment, a respective light spot (e.g. laser spot) is larger than a respective mask window (being illuminated, the light spot preferably centred on the window), e.g. with a full width half maximum (FWHM) spot size (diameter) larger than a width of the mask window by at least a factor two, three, or more but small enough, e.g. less than a factor four or five, such that the tail of the spot does not substantially illuminate an another mask window. Typically, a laser spot has a gaussian intensity profile. By masking the spot such that only a central part of the spot is passed through the mask window, the intensity profile can be relatively flat, which may benefit controlled release.

Preferably, the transparent carrier 11 of the donor substrate 10 is formed by a relatively thin foil, e.g. having a thickness "Ds" less than two, or even less than one millimeter. The thinner the transparent carrier, the easier it can be to illuminate the stack therethrough (e.g. with a mask). For example, the donor substrate 10 can be a flexible or rigid substrate. Typically, the components are very small, e.g. having a thickness "Dc", height, or other cross-section dimension less than hundred micrometer, less than fifty micrometer, or even less than thirty micrometer. Typically, the release stack "S" has a thickness "Dr" that is much smaller still, e.g. less than ten micrometer, or even less than one micrometer. Preferably, the components 15 are transferred contactlessly from the donor substrate 10 to the acceptor substrate 20, e.g. over a transfer distance "Dt" between one and hundred micrometer, preferably between twenty and sixty micrometer. These ranges can, on the one hand provide sufficient distance to prevent inadvertent contact, and on the other hand be sufficiently proximate to allow controlled transfer. Alternatively, also other distances can be used. In some embodiments, it is preferable that the transfer distance is larger than the thickness of the component, so the technology can also be used for repair purposes.

In one embodiment, the light-absorbing layer 12 has a layer thickness less than 500 nm, preferably less than 250 nm, e.g. between 50-150 nm. Providing a relatively thin light-absorbing layer 12 can allow relatively rapid heating of this layer. On the other hand the layer may need some thickness to absorb the light. In another or further embodiment, the melt layer 13 has a layer thickness less than 500 nm, preferably less than 250 nm, e.g. between 50-150 nm. Providing a relatively thin melt layer 13 can allow relatively rapid heating and melting of this layer. On the other hand the layer may need some thickness to provide its function. In another or further embodiment, the melt layer 13 has a layer thickness less than one micrometer, e.g. between 50-500 nm. In principle, the thinner the adhesive layer 14, the less material need later be cleaned (if this is even needed at all). On the other hand the layer may need some thickness dependent on its function, e.g. more than 250 nm. Also other layer thicknesses can be used.

As a non-limiting example, a donor substrate was prepared as follows. Starting with a clean quartz/glass transparent carrier, a light-absorbing layer of 130 nm molybdenum is sputtered onto the carrier. A melt layer of 120 nm aluminium is sputtered onto the previous layer. An adhesive layer of 500 nm SU-8 is spin coated onto the previous layer. The carrier and stack are soft baked at 95° C. for 2 minutes. Components are vacuum laminated onto the carrier/stack for 15 minutes at 120 C. Temporary polymeric tape is removed from the components. Oxygen plasma is applied for 1 hour at 500 W to remove SU-8 in between components. Aluminium and molybdenum are etched for 2 minutes in PES etchant 77-23-04. SU-8 resist is hard baked at 250° C. for 3 hours. Of course also other materials, layer thicknesses, temperatures, et cetera, can be used.

In some embodiments, the mask 30 is formed by a pattern of light absorbing material disposed on a transparent carrier forming respective mask windows which can be aligned with parts of the release stack "S" holding respective components 15. As a non-limiting example, a mask substrate was prepared as follows. Starting with a clean quartz/glass transparent carrier, a light-absorbing layer of 130 nm molybdenum is sputtered onto the carrier. A 2 μm HPR504 resist is spin coat onto the light-absorbing layer. The stack is soft bake at 95° C. for 2 minutes. The resist is selectively illuminated according to the mask pattern. HPR504 resist is developing. The HPR504 resist is—hard baked at 120° C. for 2 minutes. Molybdenum is etching for 30 seconds in PS etchant. HPR504 resist is removed by micro stripping. The mask substrate is cleaned. Advantageously the same or similar light-absorbing material can be used for the mask 30 as for the light-absorbing layer 12 in the release stack "S". Also other materials can be used, e.g. a standard chrome on quartz mask, as chromium melts at 1907° C. and damage will not occur at the fluence and laser power to melt the aluminium layer.

Figure 3B:
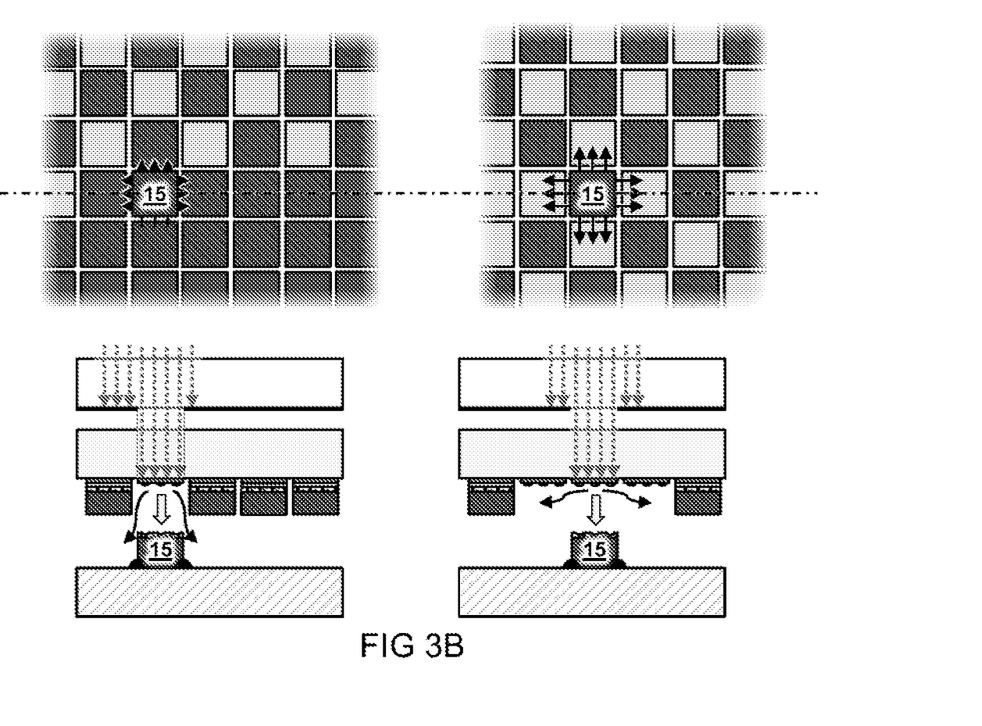
FIG. 3B illustrates sequential release of the components.

FIG. 3B illustrates sequential release of the components 15. In some embodiments, the components are released from the donor substrate 10 according to a specific sequence wherein at least some, preferably a majority of the component, most preferably each component 15 in the sequence selected for release either has four directly adjacent neighbouring components on all sides (as shown in FIG. 3B left side), or no directly adjacent neighbouring components on any side (as shown in FIG. 3B right side). In one embodiment, also a combination can be used, e.g. two directly adjacent neighbouring components on a first set of two opposite sides and no directly adjacent component on a second set of opposite sides (not shown). For example, the absent neighbouring components may have been absent initially or released previously when they were surrounded by the still present components. By balancing the presence or absence of directly adjacent neighbouring components on opposite sides, the release of the component can be more balanced, e.g. allow gas generation of the adhesive layer to propel the components away with controlled directionality. For example, the components can be released according to a checkerboard pattern as shown. Also other patterns may be envisaged. Furthermore, it will be appreciated that the while the release sequence provides particular advantages in combination with the specific release stacks described herein, the sequence can in principle benefit light induced transfer of components using any type of release stack, in particular where the components are released involving gas generation in the stack.

Figure 4A:
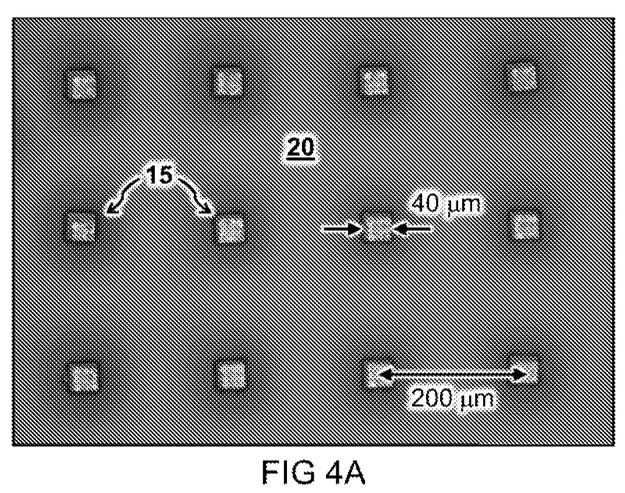
FIGS. 4A and 4B illustrate photographs of components transferred to an acceptor substrate.
Figure 4B:
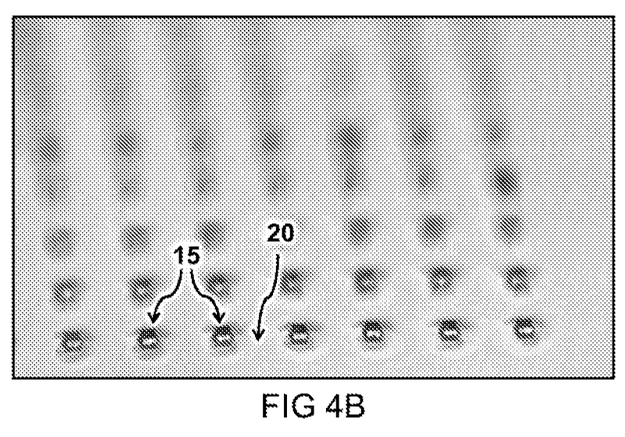
Figure 4C:
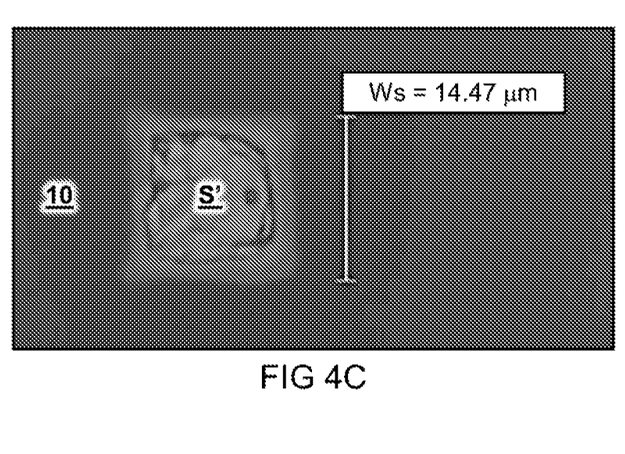
FIG. 4C illustrates part of the remaining stack on the donor substrate.

FIGS. 4A and 4B illustrate photographs of components 15 transferred to an acceptor substrate 20 using the methods described herein. In this case the transferred components are 40×40 µm² chips with 200 µm pixel pitch. FIG. 4C illustrates part of a remaining stack S' on the donor substrate 10. In this case molten Aluminium on Molybdenum is visible after the component is transferred. As shown, the width "Ws" of the remaining stack is about 15 µm, e.g. smaller than the transferred component.

Figure 5A:
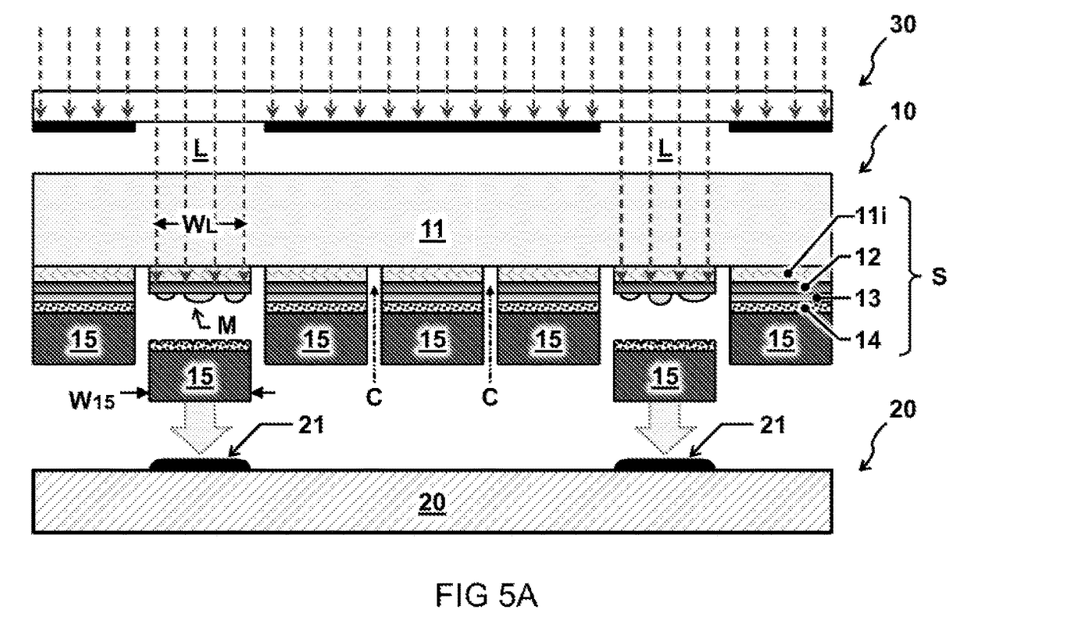
FIGS. 5A and 5B illustrate further layers in the release stack.

FIG. 5A illustrate an embodiment wherein the donor substrate 10, e.g. stack "S", comprises a thermal insulating layer 11i between the transparent carrier 11 and the light-absorbing layer 12. Accordingly, both the thermal insulating layer 11i and light-absorbing layer 12 can be disposed between the transparent carrier 11 and the melt layer 13. In some embodiments, the thermal insulating layer 11i has a relatively low heat conductivity, e.g. lower than that of a material forming the transparent carrier 11. In other or further embodiments, the thermal insulating layer 11i has a relatively high transparency (for the light beam "L"), e.g. higher than a material forming the light-absorbing layer 12. Advantageously the relatively transparent thermal insulating can allow the light beam "L" to pass through from the transparent carrier 11 to illuminate and heat the light-absorbing layer 12, while preventing or at least lowering heat transfer from the light-absorbing layer 12 back to the transparent carrier 11. In this way, heat may be more efficiently transferred to the melt layer 13. In one embodiment, e.g. as shown, the thermal insulating layer 11i is segmented between the components 15. This may further lower heat transfer back to the transparent carrier 11 and/or lower heat transfer between neighbouring components. It will be understood that while the thermal insulating layer 11i is shown here with a specific embodiment, the layer can also be applied in combination with any of the other embodiments as described herein (segmented or not).

Figure 5B:
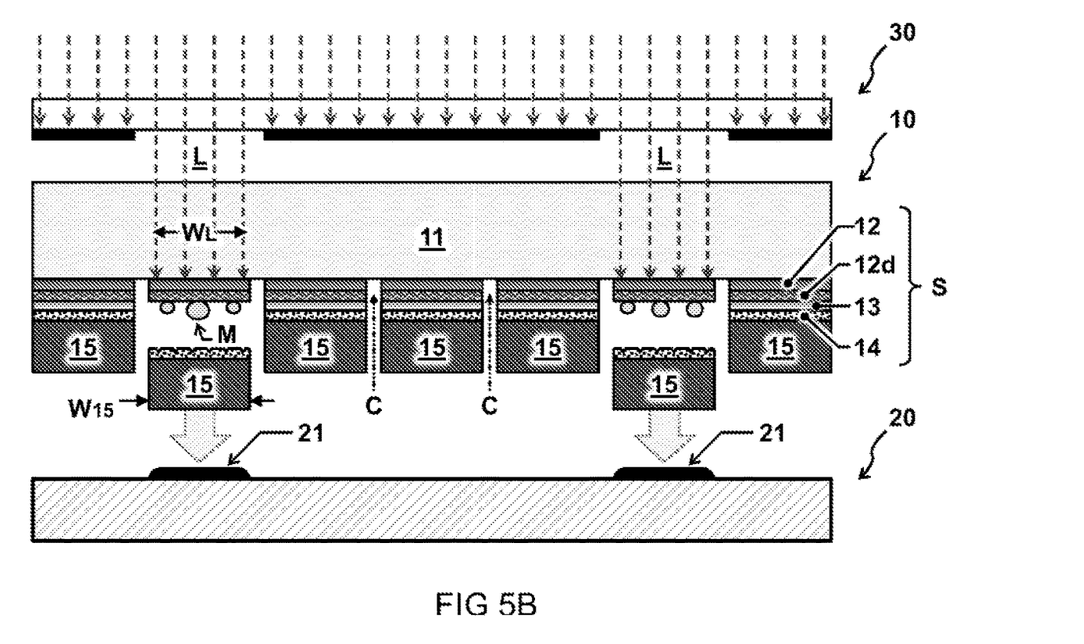

FIG. 5B illustrate an embodiment wherein the donor substrate 10, e.g. stack "S", comprises a de-wetting layer 12d between the light-absorbing layer 12 and the melt layer 13. Generally, dewetting describes the process of retraction of a fluid from a surface it was forced to cover, in this case retraction of the melted material "M" of the melt layer 13 from the de-wetting layer 12d. One factor describing the spontaneous spreading and dewetting for a drop of liquid on a surface solid (e.g. with ambient gas), is the so-called spreading coefficient "S". When S>0 spontaneous spreading occurs, and if S<0, partial wetting or dewetting may be observed. Alternatively, or additionally, wetting and dewetting can be described by the equilibrium contact angle θc of a drop of liquid on the surface. When the surface is more wetting, the contact angle may be smaller; and when the surface is more de-wetting, the contact angle may be smaller. In some embodiments, the de-wetting layer 12d is applied to promote de-wetting of the melted material "M" of the melt layer 13 compared to the light-absorbing layer 12. For example, the spreading coefficient for the melted material "M" on the de-wetting layer 12d is lower and/or the equilibrium contact angle is higher, than for the melted material "M" on the light-absorbing layer 12. The controlled de-wetting may have various advantages such as retracting the melted material "M" which can improve release adhesion of a select component 15. The retraction can also help push the select component by local accumulation of material. Preferably, the de-wetting layer 12d has a higher melting temperature than that of the melt layer 13. Preferably, the de-wetting layer 12d has a relatively good heat conductivity and/or is relatively thin, so that heat transfer from the light-absorbing layer 12 to the melt layer 13 is minimally affected, or not affected at all. For example, the de-wetting layer 12d may have the same or similar, or higher, heat conductivity compared to the light-absorbing layer 12. In some embodiments, the de-wetting layer 12d is formed by a (thin) coating, e.g. monolayer, on the light-absorbing layer 12. Accordingly, the heated light-absorbing layer 12 can be in thermal contact with the melt layer 13 via the de-wetting layer 12d (which may also be considered part of the light-absorbing layer 12).

Figure 6:
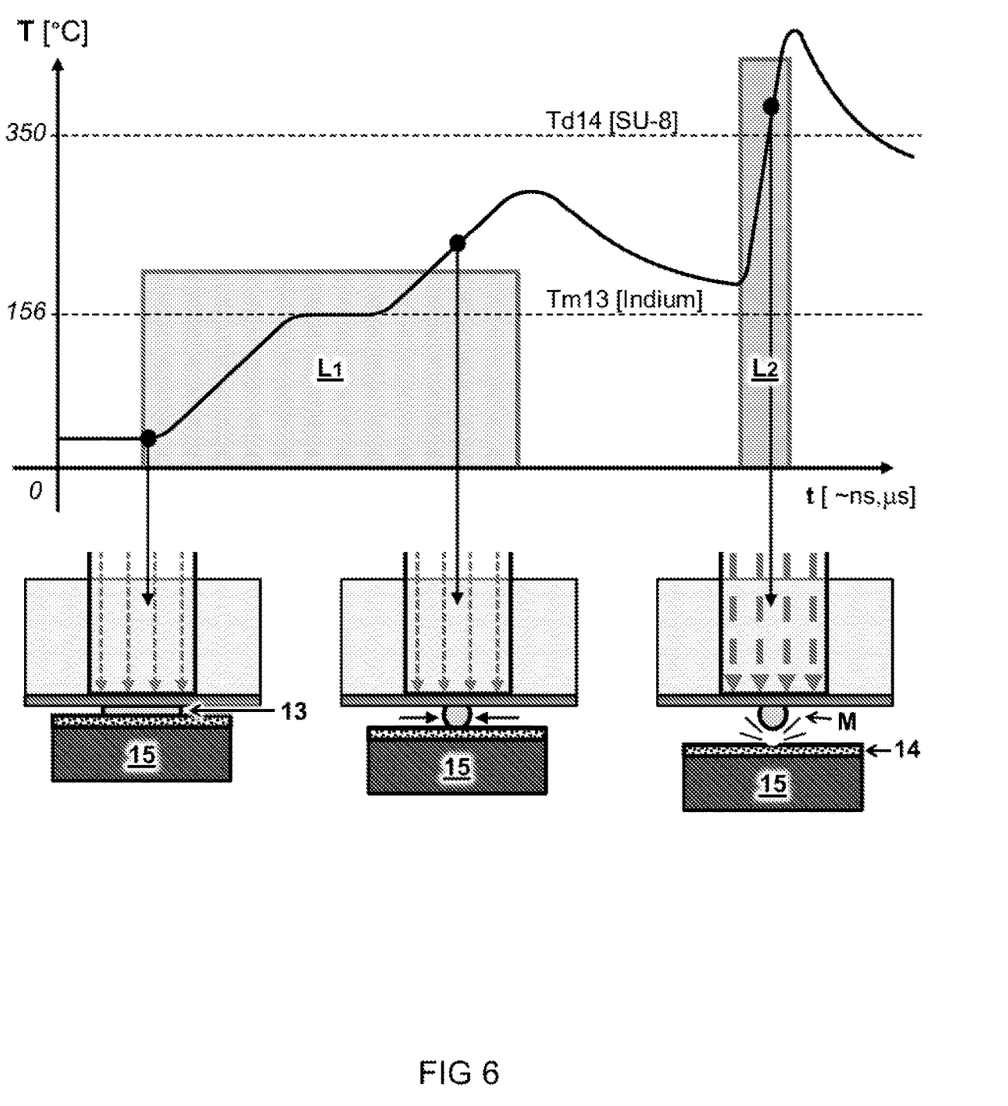
FIG. 6 illustrates a sequence of releasing a component by multiple light pulses.

FIG. 6 illustrates releasing a component 15 from a donor substrate 10 by illuminating the release stack S, as described in the embodiments above, with multiple light pulses. Some embodiment comprise illuminating a respective area of the light-absorbing layer forming part of a respective release stack holding a respective component, with a first light pulse L1 to heat the respective part of the light-absorbing layer and initiate and/or complete melting the adjacent part of the melt layer. Other or further embodiments comprise illuminating the respective area of the light-absorbing layer with a second light pulse L2 to further promote release of the component 15 from the partially or fully melted material "M" of the melt layer 13. In one embodiment, the first light pulse L1 is relatively long, e.g. sufficiently long to completely melt the melt layer 13, as illustrated. In another or further embodiment, the melt layer 13 may be at least partially melted by the first light pulse L1. In another or further embodiment, the second light pulse L2 is relatively short and/or has relatively high power compared to the first light pulse L1. In some embodiments, the first light pulse L1 causes a relatively gradual melting of the melt layer 13, e.g. with a pulse length of more >1 ns, >10 ns, >100 ns, or even >1 µs. In other or further embodiments, the second light pulse L2 causes a relatively high heat flux, e.g. with a pulse length<1 µs, <100 ns, <10 ns, <1 ns, <100 µs, or even less. For example, the sudden high heat flux may further promote release of the component 15 from the partially or fully melted material "M". For example, second light pulse L2 may cause a shockwave in the melted material and/or at least partial disintegration of the adhesive layer. In some embodiments, the first light pulse L1 causes contact area reduction of the melted material, e.g. by dewetting on the light-absorbing layer or optional de-wetting layer. In some embodiments, the second light pulse L2 causes a final push to release the component, e.g. by gas generation through decomposition or otherwise. While the present figure shows two separate light pulses, other or further embodiments may achieve a similar effect using a single modulated light pulse, e.g. ramping up power at the end of the pulse. It can also be envisaged to use more than two pulses. In some embodiments, e.g. as shown, the disintegration temperature Td14 of the adhesive layer 14 is higher than the melting temperature Tm13 of the melt layer 13. In other embodiments, e.g. as shown and described with reference to in FIG. 1B, this can also be reversed [e.g. within a certain margin such as Td14>(Tm13−300K)].

In interpreting the appended claims, it should be understood that the word "comprising" does not exclude the presence of other elements or acts than those listed in a given claim; the word "a" or "an" preceding an element does not exclude the presence of a plurality of such elements; any

The invention claimed is:

1. A method for light induced transfer of components from a donor substrate to an acceptor substrate, wherein the donor substrate comprises;
   a transparent carrier configured to carry the components facing the acceptor substrate, and
   a release stack disposed between the transparent carrier and the components for releasing one or more of the components from the donor substrate onto the acceptor substrate following illumination of the release stack by a light beam through the transparent carrier, wherein the release stack comprises:
      a melt layer formed by a metal or alloy layer having a first melting temperature,
      a light-absorbing layer disposed between the transparent carrier and the melt layer, wherein the light-absorbing layer has an absorption coefficient for absorbing the light beam thereby causing the light-absorbing layer to be heated, wherein the heated light-absorbing layer is in thermal contact with the melt layer for conducting its heat to the melt layer thereby causing a temperature of the melt layer to rise above the first melting temperature, wherein the light-absorbing layer has a second melting temperature which is higher than the first melting temperature of the melt layer such that the light-absorbing layer can remain solid while the melt layer is melted by the heat conducted from the light-absorbing layer, and
      an adhesive layer formed by an organic or non-metal layer adhering the components to the melt layer while the melt layer is solid and releasing adhesion when the melt layer is melted; and
   wherein the method comprises illuminating an area of the light-absorbing layer, forming a part of the release stack holding a respective component, with a light beam through the transparent carrier to heat a respective part of the light-absorbing layer, wherein the heat is conducted to an adjacent melt layer of the release stack thereby melting the adjacent melt layer while the respective part of the light-absorbing layer remains solid, wherein the melting of the adjacent melt layer causes a loss of adhesion between the adjacent melt layer and a respective part of the adhesive layer of the release stack adhering the respective components to the adjacent melt layer, and wherein the loss of adhesion causes release and transfer of the respective component.

2. The method according to claim 1, wherein the light-absorbing layer comprises a second metal layer formed of a different material than the melt layer.

3. The method according to claim 1, wherein the adhesive layer comprises a polymer based adhesive.

4. The method according to claim 1, wherein the light-absorbing layer has a higher surface energy per unit area than the adhesive layer,
   wherein, upon melting of a melt layer in the release stack of a selected component, the melt layer predominantly sticks to the light-absorbing layer of the release stack while the adhesive layer of the selected components predominantly sticks to the selected component,
   wherein the adhesive layer is transferred to the acceptor substrate with the selected component while the melt layer predominantly remains with part of the release stack on the donor substrate, and
   wherein the transferred adhesive layer is removed from the selected component after transfer.

5. The method according to claim 1, wherein the light beam illuminating the release stack is configured to cause a temperature of the melt layer to rise above the first melting temperature but remain below its evaporation temperature.

6. The method according to claim 1, wherein the adhesive layer has a disintegration temperature that is above the first melting temperature of the melt layer, or higher than three hundred degrees Kelvin below the first melting temperature of the melt layer.

7. The method according to claim 1, wherein at least one of the adhesive layer, the melt layer, and or the light-absorbing layer is segmented between the components.

8. The method according to claim 1, wherein an area of a first portion of the melt layer holding a respective component is smaller than an area of a second portion of the respective component by at least a factor two.

9. The method according to claim 1, wherein a mask is aligned with the donor substrate,
   wherein the mask comprises a set of mask windows aligned with a subset of the components on the donor substrate,
   wherein, a set of light spots is used to sequentially or simultaneously illuminate the set of mask windows for release of respective components,
   wherein a respective light spot is larger than a respective mask window being illuminated, and
   wherein a light spot has a full width half maximum spot size diameter that is larger than a width of the mask window by at least a factor two.

10. The method according to claim 1, wherein the components are released from the donor substrate according to a sequence, wherein each component in the sequence selected for release has:
    four directly adjacent neighboring components on all sides,
    no directly adjacent neighboring components on any side, or
    two directly adjacent neighboring components on a first set of two opposite sides and no directly adjacent component on a second set of opposite sides.

11. The method according to claim 1, wherein the light-absorbing layer is configured to absorb at least fifty percent of the light beam illuminating the release stack,
    wherein the light beam is configured to exclusively illuminate a subarea of the light-absorbing layer forming part of a selected release stack holding a selected component, without illuminating immediately adjacent areas the light-absorbing layer, thereby exclusively releasing the selected component while adjacent components remain attached to the donor substrate.

12. The method according to claim 1, wherein the first melting temperature of the melt layer is less than six hundred degrees Kelvin, wherein the second melting temperature of the light-absorbing layer is higher than the first melting temperature of the melt layer by at least one hundred degrees Kelvin.

13. A donor substrate comprising:
    a transparent carrier carrying components for light induced transfer with a release stack disposed between the transparent carrier and the components for releasing one or more of the components from the donor substrate following illumination of the release stack by a light beam through the transparent carrier, wherein the release stack comprises:
- a melt layer formed by a metal or alloy layer having first melting temperature,
- a light-absorbing layer disposed between the transparent carrier and the melt layer, wherein the light-absorbing layer has an absorption coefficient for absorbing at least ten percent of a light beam in a wavelength range between 100-200 nm and a pulse length less than ten nanoseconds, thereby causing the light-absorbing layer to be heated, wherein the light-absorbing layer is in thermal contact with the melt layer for conducting its heat to the melt layer thereby causing a temperature of the melt layer to rise above the first melting temperature, wherein the light-absorbing layer has a second melting temperature which is higher than the first melting temperature of the melt layer such that the light-absorbing layer can remain solid while the melt layer is melted by the heat conducted from the light-absorbing layer, and
- an adhesive layer formed by an organic or non-metal layer configured to adhere the components to the melt layer while the melt layer is solid and release adhesion when the melt layer is melted.

14. A system for light induced transfer of components, the system comprising:
- a light source configured to generate a light beam;
- a donor substrate comprising a transparent carrier and a release stack with a light-absorbing layer, a melt layer, and an adhesive layer holding one or more components for light induced transfer by the light beam; and
- an acceptor substrate configured to receive the one or more components transferred from the donor substrate by the light beam;

wherein the release stack is disposed between the transparent carrier and the one or more components for releasing the one or more components from the donor substrate following illumination of at least part of the release stack by the light beam through the transparent carrier, wherein the melt layer is formed by a metal or alloy layer having a first melting temperature, wherein the light-absorbing layer is disposed between the transparent carrier and the melt layer, wherein the light-absorbing layer is configured to absorb at least part of the light beam to cause an illuminated part of the light-absorbing layer to be heated by the light beam, wherein the light-absorbing layer is in thermal contact with the melt layer for conducting its heat to the melt layer thereby causing a temperature of the melt layer to rise above its melting temperature, wherein the light-absorbing layer has a second melting temperature which is higher than the first melting temperature of the melt layer such that the light-absorbing layer can remain solid while the melt layer is melted by the heat conducted from the light-absorbing layer; and wherein the adhesive layer is formed by an organic or non-metal layer configured to adhere the one or more components to the melt layer while the melt layer is solid and releasing adhesion when the melt layer is melted.

15. The system according to claim 14, wherein at least one of the adhesive layer, the melt layer, and the light-absorbing layer is segmented between the components.

16. The donor substrate according to claim 13, wherein at least one of the adhesive layer, the melt layer, and the light-absorbing layer is segmented between the components.

* * * * *